(12) United States Patent
Hsia et al.

(10) Patent No.: US 6,291,361 B1
(45) Date of Patent: Sep. 18, 2001

(54) METHOD AND APPARATUS FOR HIGH-RESOLUTION IN-SITU PLASMA ETCHING OF INORGANIC AND METAL FILMS

(75) Inventors: Shao-Wen Hsia, Mission Viejo, CA (US); Michael J. Berg, Mechanicsville, VA (US); Maureen R. Brongo, Laguna Hills, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/275,628

(22) Filed: Mar. 24, 1999

(51) Int. Cl.$^7$ ................................................ H01L 21/00
(52) U.S. Cl. ........................ 438/738; 438/743; 438/744
(58) Field of Search ................................ 438/700, 710, 438/712, 717, 718, 723, 724, 738, 743, 744

(56) References Cited

U.S. PATENT DOCUMENTS

| | | | |
|---|---|---|---|
| 5,403,436 | 4/1995 | Fujimura et al. | 156/643 |
| 5,702,981 * | 12/1997 | Maniar et al. | 437/192 |
| 5,759,916 * | 6/1998 | Hsu et al. | 438/636 |
| 5,846,884 * | 12/1998 | Naeem et al. | 438/714 |
| 5,883,007 * | 3/1999 | Abraham et al. | 438/714 |
| 5,911,887 * | 6/1999 | Smith et al. | 216/72 |
| 6,013,582 * | 1/2000 | Ionov et al. | 438/738 |

* cited by examiner

Primary Examiner—Felisa Hiteshew
Assistant Examiner—Kin-Chan Chen
(74) Attorney, Agent, or Firm—Snell & Wilmer, L.L.P.

(57) ABSTRACT

Method and apparatus for plasma etching both metal and inorganic dielectric layers in a single chamber during deep sub-micron semiconductor fabrication. Fluorine based chemistries, or a mixture of fluorine and chlorine based chemistries, are used to etch the inorganic dielectric layer. A switch is then made to chlorine based chemistries, within the same etching chamber, which are utilized to etch the metal layer. Overetching may also be performed with chlorine based chemistries to clear any residuals.

11 Claims, 7 Drawing Sheets

PRIOR ART

FIG.3a

PRIOR ART

METHOD AND APPARATUS FOR HIGH-RESOLUTION IN-SITU PLASMA ETCHING OF INORGANIC AND METAL FILMS

BACKGROUND OF THE INVENTION

1. Technical Field

The present invention relates, generally, to etching methods and apparatus for deep sub-micron semiconductor fabrication and, more particularly, to methods and apparatus for plasma etching both metal and inorganic layers in a single chamber.

2. Background Art and Technical Problems

Recent advances in semiconductor processing technology have led to the development of integrated circuit devices employing sub-micron and even deep sub-half-micron feature sizes. Deep sub-micron technologies, involving critical dimensions or feature sizes of less than 0.35 microns, require photo lithographic processes which employ progressively smaller incident wavelengths during the exposure process.

In addition, deep sub-micron feature sizes have spawned the development of sophisticated new photoresist recipes for use with these smaller wavelengths.

Deep sub-micron line widths also tend to drive a reduction in the thickness of the photoresist layers in order to maintain acceptable aspect ratios for the photoresist patterns. However, the use of thinner photoresist pattern layers has resulted in undesired erosion of the patterned microelectronic structure during the metal etch process.

Presently known attempts to preserve the integrity of the microelectronic structures in the presence of thin photoresist layers typically involve the use of metallic barrier layers, such as titanium nitride (TiN), in the metal stack. In addition, organic anti-reflection coating (ARC) layers have been employed on top of metallic barrier layers to help preserve the structural integrity of the photoresist pattern structures. Prior art practice has also utilized an oxide layer prior to the organic ARC layer to function as a hard mask. However, many of the different layers utilized in the prior art require different etching chemistries and etching tools thereby increasing processing time as well as equipment needed for fabricating semiconductor devices.

Although the use of these organic or metallic ARC layers has improved the integrity of the photoresist pattern structures, as well as the integrity of the resulting microelectronic structures, erosion of the patterned microelectronic structure may still occur in the case where all of the photoresist layer erodes away during metal etching, particularly when an organic ARC layer is used in the metal stack without an oxide hard mask.

Alternatively as contemplated by part of the present invention, an inorganic ARC layer may be used in the metal stack which provides a single optimized film that functions both as an antireflective coating, for preserving the structural integrity of the photoresist pattern strictures, and as a hard mask. Unlike the organic ARC layers and metal layers, inorganic ARC layers are typically etched with fluorine based chemistries. Since the process for etching the photoresist and the ARC layer, and the process for etching the metal layer, typically employ different etching tools which are specifically designed to optimize their respective etching processes and etching solution chemistries, the number of process steps and cycle time are increased.

Accordingly, there is a need for composite structures and manufacturing processes that accommodate smaller exposure wavelengths and thinner photoresist layers without jeopardizing the integrity of the microelectronic structures. In addition, there is also a need for composite structures and manufacturing processes which function to decrease the cost and complexity of the semiconductor fabrication process while increasing its efficiency.

SUMMARY OF THE INVENTION

In accordance with a preferred embodiment of the present invention, a metal layer upon which photoresist patterns are developed comprises a sandwiched metal stack having a layer of conducting metal (aluminum, titanium, and the like) bounded by an upper thin-film ARC layer and a bottom thin-film barrier layer, wherein at least the top layer is composed of an inorganic dielectric substance. The use of an inorganic dielectric top ARC layer facilitates use of thinner photoresist layers while preserving the integrity of the photoresist pattern for deep sub-micron feature sizes. In addition, the inorganic ARC layer functions as a hard mask during the metal etch process, further enhancing the integrity of the metallic microelectronic strictures even as the photoresist is eroded during the metal etch process.

In accordance with a further aspect of the present invention, the inorganic dielectric layer may be applied utilizing a chemical vapor deposition (CVD) process. In accordance with a particular preferred embodiment, the inorganic dielectric ARC layer may be applied in a plasma enhanced CVD (PECVD) chamber.

In accordance with a further aspect of the present invention, the use of PECVD deposition techniques permits the application of the dielectric layer in a conformal manner, i.e., a uniform thickness of the dielectric may be applied to surfaces which are not perfectly planar, for example surfaces which contain a layer of microelectronic structures. This is a distinct advantage over prior art systems, wherein organic ARC layers are typically applied using a spin coat technique.

In accordance with a further aspect of the present invention, the etch selectivity of the metal etch medium is greatly enhanced in that the inorganic ARC is less susceptible to erosion during the metal etch process than prior art organic or metallic ARC layers.

In accordance with yet a further aspect of the present invention, the inorganic dielectric layer may be incorporated into the interconnect structure, without having to be removed in a subsequent processing step.

In accordance with a still further aspect of the present invention, the process of etching the inorganic dielectric layer down to the metal layer may be performed in the same tool within which the metal etching process is performed, thereby eliminating the need to change tooling between the dielectric etching step and the metal etching step.

In accordance with yet a further aspect of the present invention, the inorganic dielectric ARC layer may be etched using a fluorine based etching chemistry, immediately followed by the in-situ transition to a chlorine based etching process for the metal etching step.

Various other aspects and advantages of the present invention are set forth with particularity in the detailed description of preferred exemplary embodiments.

BRIEF DESCRIPTION OF THE DRAWINGS

The present invention will hereinafter be described in conjunction with the appended drawing figures, wherein like numerals designate like elements in the various figures, and wherein:

FIG. 2b is a schematic illustration of prior art photoresist structures showing the vertical walls of the photoresist structures corrupted by the spurious reflected light shown in FIG. 2a;

DETAILED DESCRIPTION OF THE PREFERRED EXEMPLARY EMBODIMENTS

For relatively large line widths, standard photo lithographic processes typically employ G-line (436 nanometers) or I-line (365 nanometers) exposure wavelengths. However, I-line photo lithographic processes are limited to line width critical dimensions on the order of about 0.36 micron feature size; thus, for deep sub-half-micron feature sizes, deep ultraviolet exposure energies (e.g., 248 nanometers) or lower energies are needed.

Figure 1A:
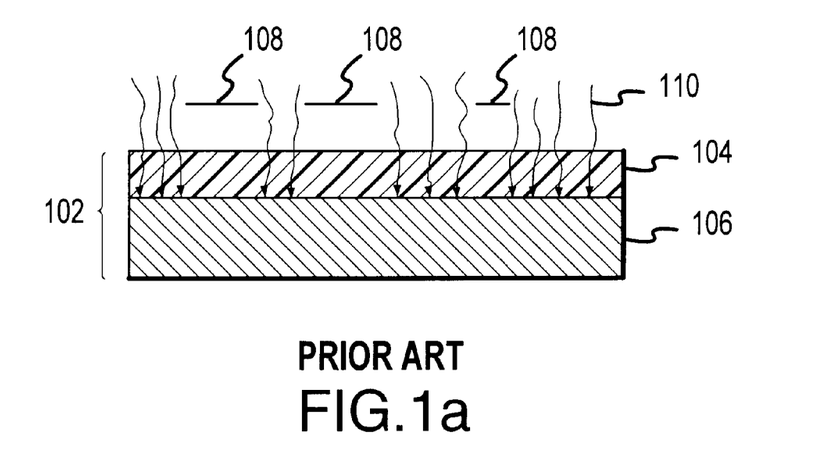
FIG. 1a is a schematic diagram of a photo lithographic exposure and development process.

FIG. 1a shows a typical interconnect substrate 102 comprising a metal layer 106 and a photoresist layer 104 disposed on top of the metal layer. As is well known in the art, exposure radiation is selectively applied to a mask or reticle to selectively expose and isolate various regions of the photoresist layer to develop a photoresist pattern. This photoresist pattern is then subsequently transferred into the metal layer.

With continued reference to FIG. 1a, mask 108 patterns the incident light rays 110 in accordance with a predetermined photoresist pattern. Consequently, light is blocked from those areas of the photoresist layer 104 corresponding to a desired printed photoresist pattern, and light is allowed to penetrate into those regions of the photoresist layer 104 which are desired to be removed during the development step. Those skilled in the art will appreciate, however, that a variety of different expose and development paradigms may be employed to arrive at a desired photoresist pattern; for example, it may be desirable to configure the mask such that the areas of the photoresist layer 104 to be removed are blocked from the light, and the areas of the photoresist layer 104 which are desired to be preserved are exposed.

Figure 1B:
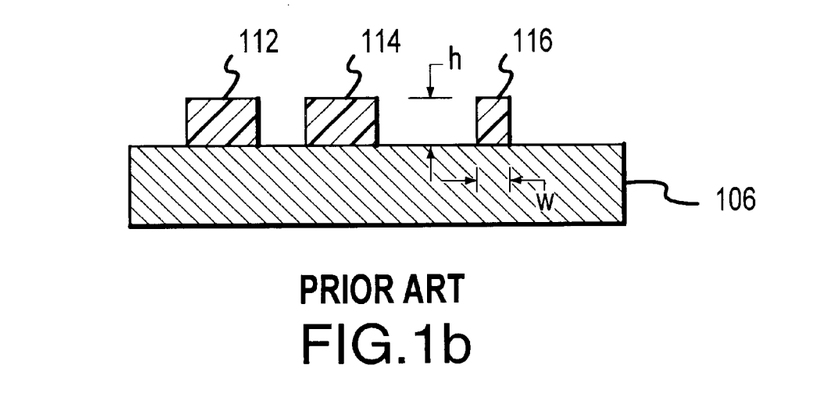
FIG. 1b is a schematic diagram of an exemplary printed photoresist pattern using prior art techniques.

With continued reference to FIG. 1a and now also referring to FIG. 1b, after the regions of photoresist layer 104 which are desired to be removed have been exposed and developed, the photoresist pattern is said to be printed upon metal layer 106. In the context of FIG. 1b, the printed photoresist pattern comprises respective photoresist structures 112,114,116.

Figure 1C:
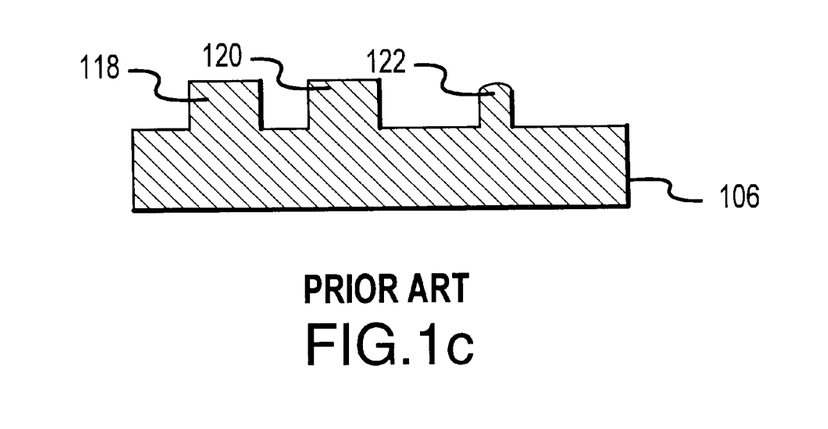
FIG. 1c is a schematic illustration of a metallic microelectronic structure after pattern and transfer, shown with compromised structural integrity as a result of a thin photoresist layer.

Referring now to FIG. 1a–c, the photoresist pattern shown in FIG. 1b is typically transferred to metal layer 106 through a metal etching process, wherein the metal 106 and the photoresist strictures 112,114,116 are simultaneously etched and removed resulting in the metal microelectronic pattern shown in FIG. 1c comprising respective metal structures 118,120,122.

As the line widths (represented by the arrows marked "w" in FIG. 1b) of the structures become smaller and smaller (e.g., less than 0.5 microns in width), the mechanical integrity of the photoresist structures 112,114,116, as well as the metallic structures 118,120,122 may become compromised. In order to prevent the photoresist and metal structures from becoming too thin or from having an excessively large vertical dimension ratios (represented by the arrows "h" in FIG. 1b) for a given line width, it is desirable to maintain an aspect ratio (h/w) on the order of 2.5 to 4.

With continued reference to FIG. 1c, it can be seen that microelectronic structure 122 exhibits compromised structural integrity; in particular, the top portion of structure 122 deviates from the desired rectilinear configuration. Those skilled in the art will appreciate this type of depth deformation typically results when the photoresist material completely or partially erodes in the metal etch process, leaving the top portion of microelectronic structure 122 exposed to the etching medium. This problem becomes exacerbated in current technologies when thinner photoresist layers are needed in order to accommodate the narrower depth of focus windows associated with deep submicron feature sizes.

Figure 2A:
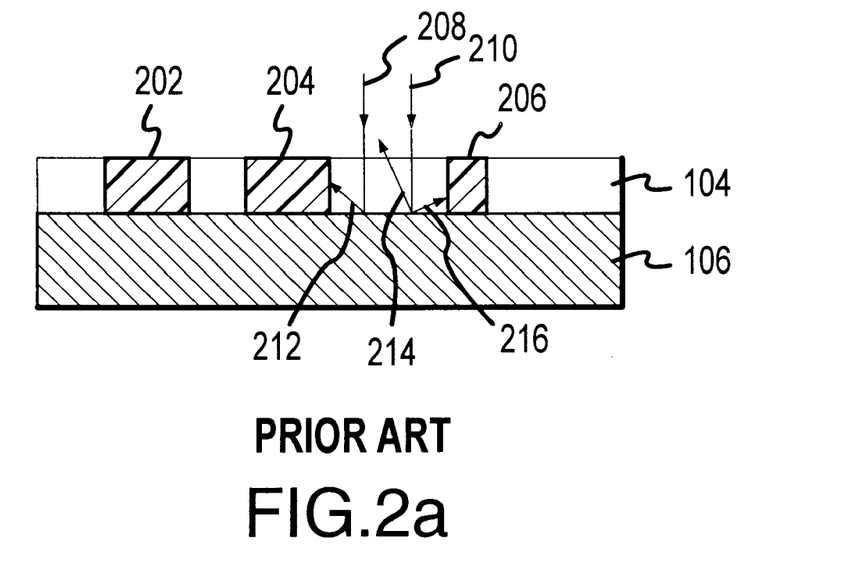
FIG. 2a is a schematic illustration of reflected incident light on the sidewall profile of photoresist structures.
Figure 2B:
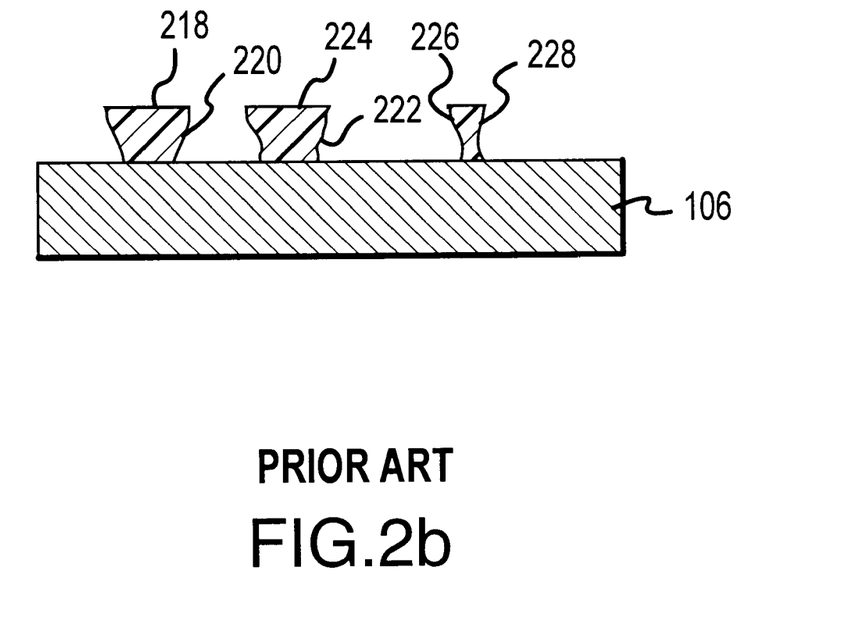

Referring to FIG. 2, presently known interconnect processing paradigms suffer from additional drawbacks beyond the profile erosion discussed in conjunction with FIG. 1. FIG. 2 illustrates a typical microelectronic substrate comprising a metal layer 106 and a photoresist layer 104. As discussed above, a photoresist pattern comprising photoresist features 202,204,206 is desirably printed on metal layer 106. Using an appropriate mask (not shown in FIG. 2) of the type discussed above in conjunction with FIG. 1, exposure energy of a predetermined wavelength, represented by light vectors 208,210 are applied to photoresist layer 104 in the vertical direction shown in FIG. 2a. In an ideal environment, these vertical rays create photoresist structures (e.g., structures 202,204,206) having straight, ideally vertical side walls. However, although the incident light rays 208,210 are generally vertically aligned, when the light waves contact the surface of metal layer 106 which adjoins photoresist layer 104, the light rays often reflect against the surface of metal layer 106, resulting in spurious reflection rays, for example reflected rays 212, 214, 216. Although photoresist structures 202,204,206 are masked to prevent them from being exposed during the exposure stage, spurious reflected rays (e.g., rays 212,216) often penetrate the side walls of the photoresist structures, resulting in undesirable exposure of portions of the side walls of the photoresist strictures. In particular, spurious ray 212 can be seen contacting the side wall of photoresist structure 204; similarly, spurious wave 216 can be seen contacting the side wall of photoresist structure 206.

Referring now to FIG. 2b, the effect of such spurious reflective light rays can be seen in the distorted, non-linear side walls of the developed photoresist structure 218 (corresponding to desired profile 202), photoresist structure 224 (corresponding to desired profile 204), and photoresist structure 226 (corresponding to desired profile 206). In particular, respective side walls 220,222,228 of respective photoresist structures 218,224,226 are partially consumed as a result of the undesired exposure of the side walls.

Figure 3A:
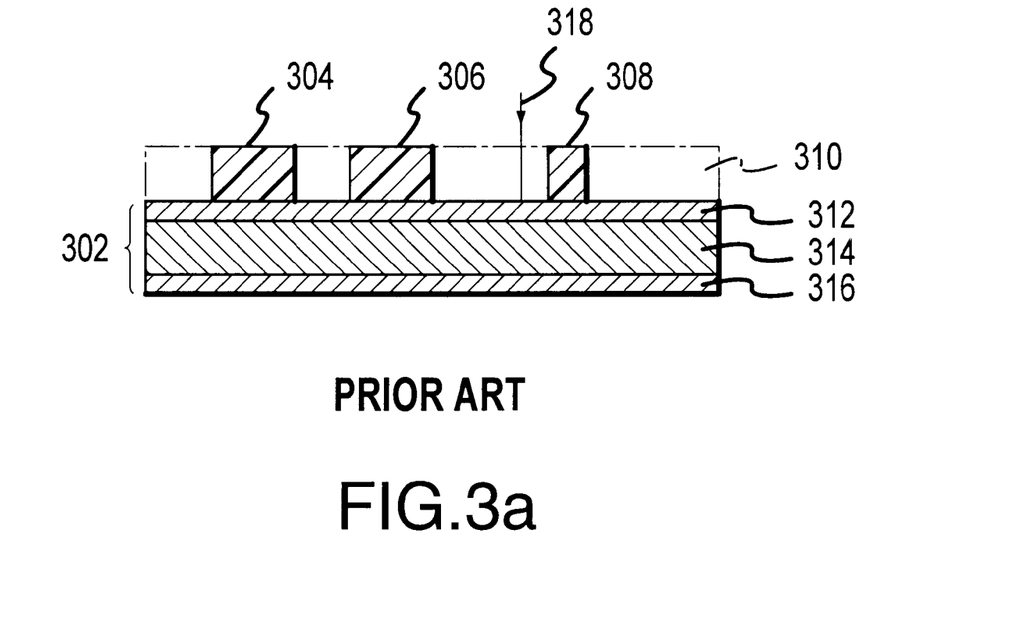
FIG. 3a is a schematic illustration of a prior art exposure and development paradigm employing an organic anti-reflective coating on the metal layer.
Figure 3B:
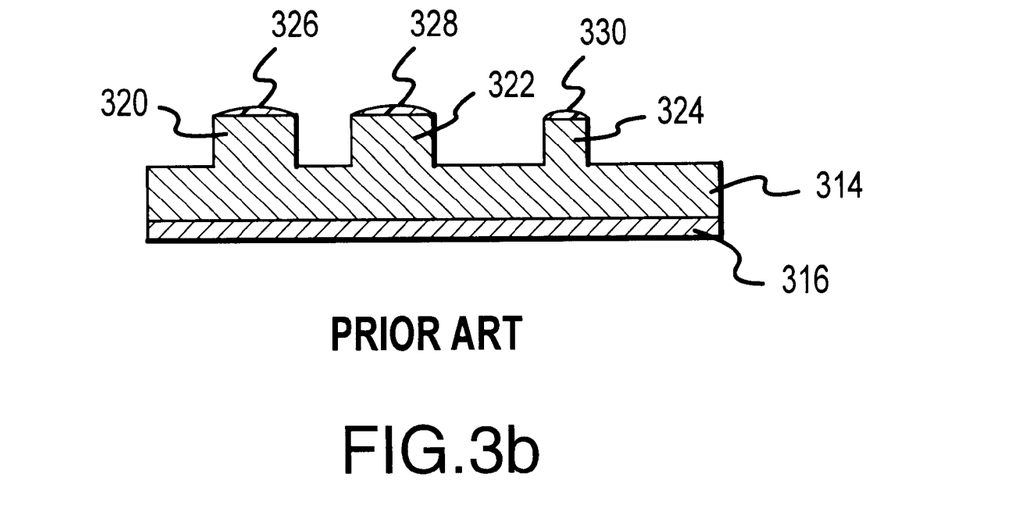
FIG. 3b is schematic illustration of a prior art photoresist pattern transfer technique produced using an organic anti-reflective coating, with the resulting preservation of the structural integrity of the metallic microelectronic structures.

Referring now to FIG. 3, presently known techniques for reducing spurious reflected light rays during photoresist patterning typically involve the use of an ARC layer 312.

More particularly, prior art processing paradigms often employ a stacked metal layer 302, for example comprising middle metal layer 314 sandwiched between a top anti-reflective coating (ARC) layer 312, and a bottom thin film barrier layer 316.

More particularly and with reference to FIG. 3a, as the vertically incident exposure energy represented by vector 318 enters photoresist layer 310, a portion of photoresist layer 310 which is desired to be removed is exposed during the exposure step. ARC layer 312, which typically comprises a material designed to absorb the exposure light, substantially reduces spurious reflected rays during the exposure step. Consequently, only that portion of photoresist layer 310 (represented by the dotted lines) is removed during the developing step, thereby resulting in substantially linear, non-eroded side walls of finished photoresist structures 304,306,308.

Initial ARC layers, for example such as ARC layer 312, are made from a metallic material, for example titanium nitride, often referred to as tinitride. Consequently, this metallic ARC layer may be etched in the same chemistry that is used for metal etching. In addition to using metallic ARC layers, organic ARC layers (not shown) have also been used to preserve the structural integrity of the photoresist layer 310 by depositing the organic ARC layer (not shown) on top of the metallic ARC layer. Further, in an effort to protect the integrity of patterned microelectronic structures produced using thin photoresist pattern layers, prior art practice has utilized an oxide layer prior to the organic ARC layer to provide hard mask protection. However, these different layers require several different etching chemistries and tools for processing which complicates fabrication of the semiconductors and increases processing times.

Referring now to FIG. 3b, the substrate of FIG. 3a is shown subsequent to the metal etching step. In particular, metal portion 314 is etched using any well known wet or dry etching technique. Photoresist structures 304,306,308 are transferred to the metal layer 314 during the metal etch process. In particular, photoresist structure 304 is transferred into the metal layer as microelectronic structure 320; photoresist structure 306 is seen transferred into the metal layer as microelectronic structure 322; and photoresist structure 308 is transferred into the metal layer as microelectronic structure 324. In circumstances where sufficiently thick photoresist layers are employed, or when a less aggressive metal etching medium is used, often the top portion of microelectronic structures 320,322 remain generally rectilinear as a result of residual photoresist 326,328 which was not consumed during the metal etching step. However, the integrity of the microelectronic structure (e.g., structure 324) may nonetheless be compromised even in the presence of ARC layer 312 due to, inter alia, one or more of the following conditions: an aggressive etching medium which fully or partially consumes the ARC layer, employing a photoresist layer which is too thin and hence is eroded during the metal etch process, and deep sub-micron feature sizes.

Figure 4:
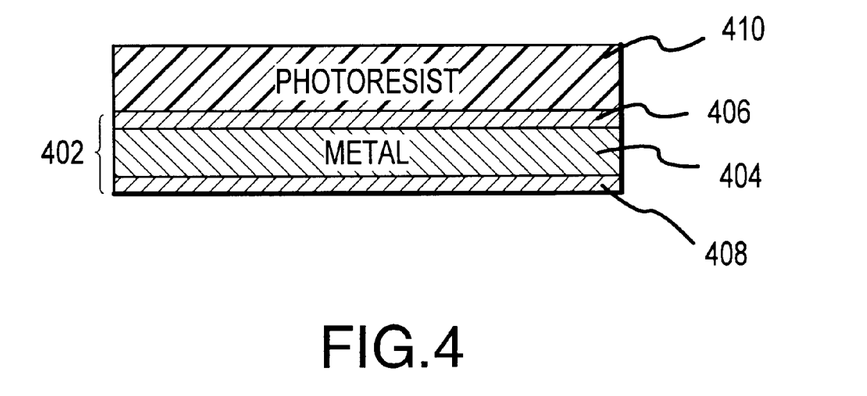
FIG. 4 is a schematic illustration of an inorganic dielectric boundary layer in accordance with the present invention.

Referring now to FIG. 4, a suitable interconnect substrate in accordance with the present invention comprises a metallic stack 402 having a photoresist layer 410 disposed thereon. In accordance with one aspect of the present invention, metallic stack 402 is suitably in the range of 1,000 to 20,000 angstroms thick, and is preferably about 5,000 to 8,000 angstroms; photoresist layer 410 is suitably on the order of 0.1 to 2 microns thick, and preferably on the order of about 0.6 to 1.0 microns thick. In accordance with a further aspect of the present invention, metallic stack 402 suitably comprises a metal layer 404 sandwiched between a first top ARC layer 406 and a second bottom barrier layer 408. Preferably, top ARC layer 406 is a dielectric, inorganic compound, for example silicon oxynitride.

In accordance with one aspect of the present invention, metal layer 404 is suitably made from aluminum, titanium, or other metals typically employed in the production of stacked semiconductor assemblies. If desired, metal layer 404 may also include gold, silver, copper, either alone, in combination, or mixed with the aluminum, titanium, or the like. Moreover, depending on the particular application, metal layer 404 may comprise tungsten, nickel, or other substances, for example if the substrate is to be employed as a memory disk or other structure other than a semiconductor stacked assembly.

With continued reference to FIG. 4, inorganic dielectric layer 406 is suitably applied to metal layer 404 in any convenient manner. In a particularly preferred embodiment, inorganic layer 406 is applied to layer 404 through chemical vapor deposition (CVD) techniques. In a particularly preferred embodiment, plasma enhanced CVD (PECVD) techniques may be employed to deposit inorganic layer 406 on metal layer 404.

Figure 5:
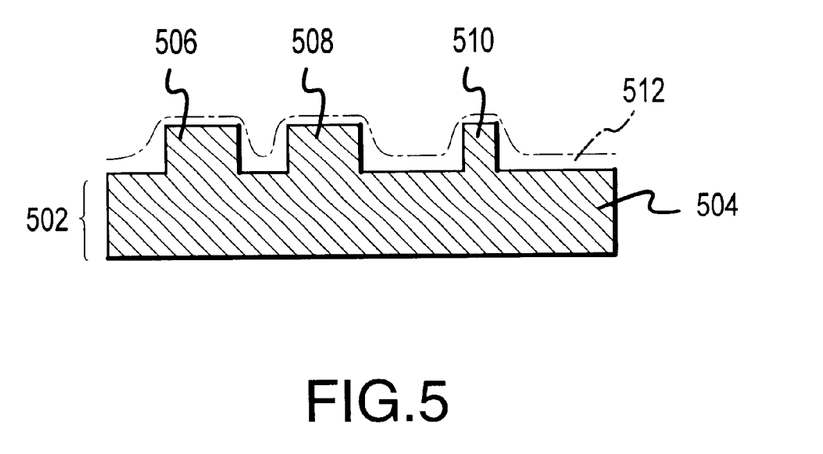
FIG. 5 is a schematic illustration of the conformal application of a dielectric boundary layer in accordance with the present invention.

Referring now to FIG. 5, an alternate embodiment of the invention is shown. In particular, an inorganic layer 512 is shown applied on the surface of metal layer 504, notwithstanding the planar surface of metal layer 504.

With continued reference to FIG. 5, metal layer 504 suitably comprises respective structures 506,508,510, for example microelectronic structures; instead, structures 506, 508,510 may also comprise steps, ridges, or other topical non-planarities other than microelectronic structures. By employing CVD or other application techniques other than traditional well-known "spin" techniques, it is possible to apply a substantially uniform thickness of the inorganic layer onto the metal layer, regardless of whether the metal layer is substantially planar or deviates from planarity. FIG. 5 thus illustrates the conformal nature of the inorganic layer to metallic layer.

After applying the inorganic layer to the metal layer as shown in FIG. 4 (or in the alternate embodiment shown in FIG. 5), it may be desirable to apply a photoresist layer 410 to the inorganic layer. In this regard, it is appreciated that the inorganic layer 406 may serve a plurality of useful purposes.

In particular, inorganic layer 406 (and inorganic layer 512 in the alternate embodiment) may effectively serve as an ARC layer, thereby enhancing the verticality of the side walls of the photoresist structures by reducing spurious reflected rays during the exposure and developing steps. In addition, as discussed in greater detail below, inorganic layer 406 may enhance the integrity of the structure of the finished microelectronic structures after metal etching, even if the residual photoresist should become partially or fully eroded.

Figure 6A:
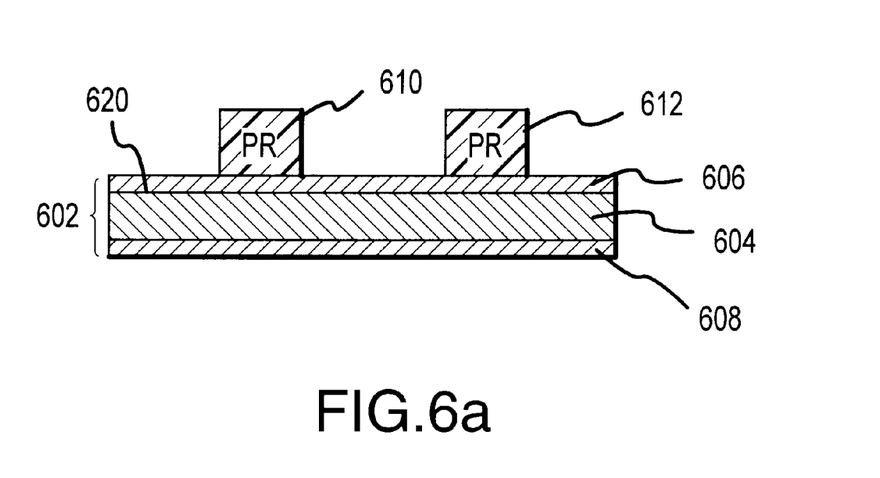
FIG. 6a is a schematic illustration of a printed photoresist pattern using an inorganic dielectric layer in accordance with the present invention.
Figure 6B:
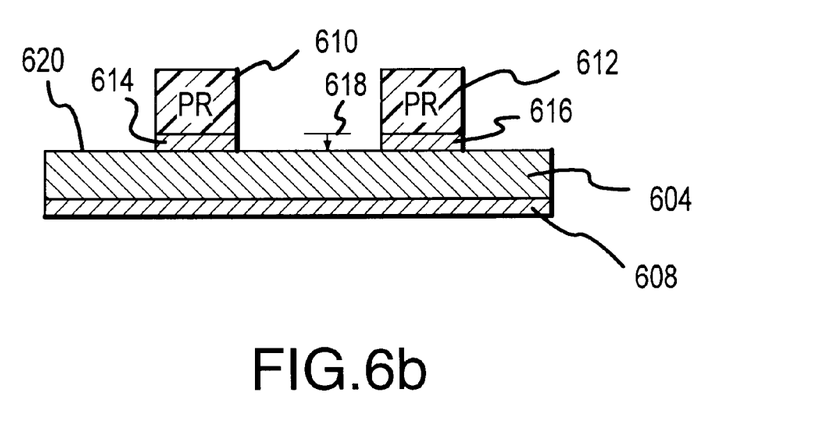
FIG. 6b is a schematic illustration of a photoresist pattern, showing the inorganic top ARC layer of FIG. 6a removed as a result of etching.
Figure 6C:
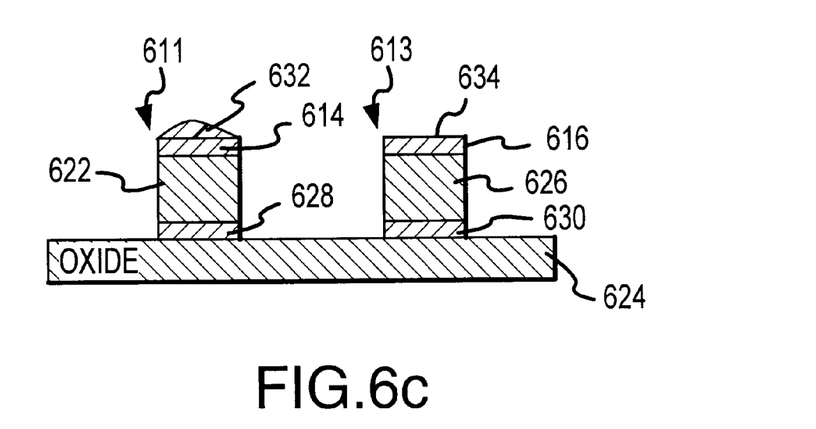
FIG. 6c is a schematic illustration of the resulting microelectronic structures subsequent to the metal etching process in accordance with the present invention.

Referring now to FIG. 6, an exemplary metal structure 602 suitably comprises a metal layer 604, an inorganic top layer 606, and a bottom barrier layer 608, which may comprise a dielectric; in a preferred embodiment, bottom barrier layer 608 is also a metal such as tinitride. As briefly discussed above in conjunction with FIGS. 4 and 5, inorganic layer 606 is also suitably applied to metal layer 604 via CVD or PECVD deposition techniques.

With particular reference to FIG. 6a, respective photoresist structures 610, 612 may be printed onto metallic stack 602, for example using, inter alia, any of the printing techniques discussed above. As can be seen in FIG. 6a, the side walls of photoresist structures 610,612 exhibit a high degree of verticality, in part because of the anti-reflective character of ARC layer 606.

In order to transfer the photoresist pattern shown in FIG. 6a into the metal layer, the structure shown in FIG. 6a typically undergoes a metal etching process. In prior art systems utilizing an organic ARC layer, the organic ARC layer may be conveniently eroded in the presence of chlorine based etching environments or directional etching environments, i.e. when a bias is applied to the etching process, that are used in metal etching. In the context of the present invention, in contrast, inorganic layer 606 is desirably etched using a fluorine based etching solution including one or more of the following chemistries: $CHF_3$, $C_2F_6$, and $CF_4$ (tetrafluormethane).

With particular reference to FIG. 6b, inorganic layer 616 is suitably etched using an appropriate etching chemistry such as, for example, those described above.

Upon completion of the ARC layer etching step, the inorganic layer 606 is positioned between metal layer 604 and respective photoresist structures 610,612. As seen in FIG. 6b, during this etching step, inorganic layer 606 is etched away, such as is indicated by arrow 618. As shown in FIG. 6b, the interconnect substrate is prepared for metal etching (i.e., etching of metal layer 604 to transfer photoresist structure 610,612 into the metal).

In accordance with a particularly preferred embodiment of the present invention, both the aforementioned inorganic etching step and the etching of metal layer 604 may advantageously be performed within the same tool, thus conserving processing steps and reducing the cost and complexity of producing the finished semiconductor interconnect structures. The details of this insitu etching process are discussed in greater detail below in conjunction with FIGS. 7 and 8.

With continued reference to FIG. 6, the substrate shown in FIG. 6b suitably undergoes metal etching, resulting in the structure shown in FIG. 6c.

With particular reference to FIG. 6c, photoresist structure 610 is suitably transferred into metal layer 604, resulting in microelectronic structure 611; similarly, photoresist structure 612 is transferred into the metal, resulting in microelectronic feature 613.

More particularly, structure 611 suitably comprises a top portion 614, a middle portion 622, and a bottom portion 628. In accordance with a preferred embodiment, top portion 614 suitably comprises that portion of inorganic layer 606 which was not etched away during the inorganic layer etching process. Middle portion 622 suitably comprises that portion of metal layer 604 which was not etched away during the metal etching step. Bottom portion 628 may comprise that portion of barrier layer 608 which was not etched during the aforementioned metal etching process; alternatively, bottom portion 628 may comprise part of barrier layer 608 and part of the bottom of metal layer 604 in the event metal layer 604 is incompletely etched. Depending on the level of the aggressiveness of the etching chemistry during the metal etch step, and further depending on such factors as the etch selectivity of the etch medium with regard to the photoresist and the metal layer 604, some residual photoresist 632 may remain on the top of microelectronic structure 611 after the completion of the metal etching step. For smaller structures (e.g., deep sub-half-micron feature sizes), or in circumstances where a very thin photoresist layer is used or a very aggressive metal (and hence photoresist) etch solution is employed, it may be possible that all of the photoresist material on the surface of microelectronic structure 613 is partially or completely eroded during the metal etch process. By employing an inorganic ARC layer 606 which results in an inorganic ARC hard mask cap 616, the structural integrity of the top portion 634 of microelectronic structure 613 is preserved; that is, even if the photoresist layer is completely eroded away, the metal etch chemistry does not dramatically effect the structure of microelectronic structure 613, inasmuch as cap portion 616 is relatively impervious to the metal etch chemistry.

Figure 7:
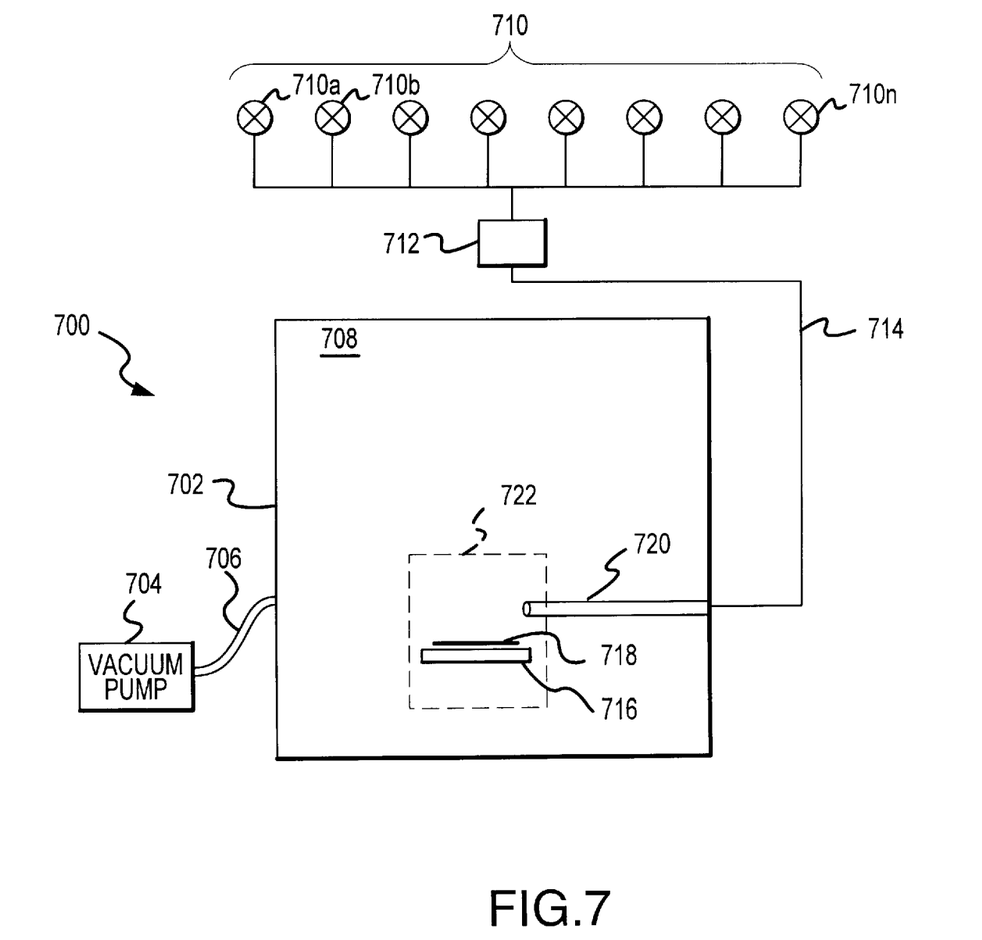
FIG. 7 is a schematic block diagram of an exemplary plasma etching chamber in accordance with the present invention.

Referring now to FIG. 7, the etching of the inorganic layer, as well as subsequent etching of the metal layer described in connection with FIG. 6, is suitably performed within the same plasma enhanced etching chamber, resulting in substantial cost efficiencies inasmuch as both etching steps may be performed in-situ, that is, in the same tool.

With continued reference to FIG. 7, a suitable plasma etching assembly 700 preferably comprises an etching chamber 702, a vacuum pump 704 connected to etching chamber 700 through a vacuum hose 706, and a plurality of respective mask flow controllers (MFC) 710 which are suitably connected through a mixing valve or flow regulator 712 and a gas inlet conduit 714 to etching chamber 702. In the interior region 708 of etching chamber 702, a plasma zone 722 is suitably maintained. In a preferred embodiment, plasma etching chamber 702 may be obtained from Applied Materials, Inc. under the product designation decoupled plasma source or DPS.

Internal region 708 of metal etch chamber 702 suitably comprises a workpiece support 716, for example an electrostatic chuck (ESC), configured to support a semiconductor interconnect substrate (such as shown in FIG. 6) 718 within the plasma region 722. Those skilled in the art will appreciate that appropriate temperature control mechanisms may be incorporated into chuck 716 and/or into the side walls or other interior region of chamber 702 to control the temperature at the workpiece surface during the etching process. Moreover, those skilled in the art will further appreciate that an appropriate pressure may be maintained by vacuum pump 704 during the etching process. It is further understood that appropriate contamination control, ventilation, and other well known parameters may be accommodated by etching system 700.

The various gasses used to effect the etching processes are conveniently applied into plasma region 722 through a gas inlet conduit 720 connected to external conduit 714. In a preferred embodiment, the various MFC's 710, control valve 712, and the various other processing parameters are conveniently controlled though the use of a personal computer or other known control device.

Figure 8:
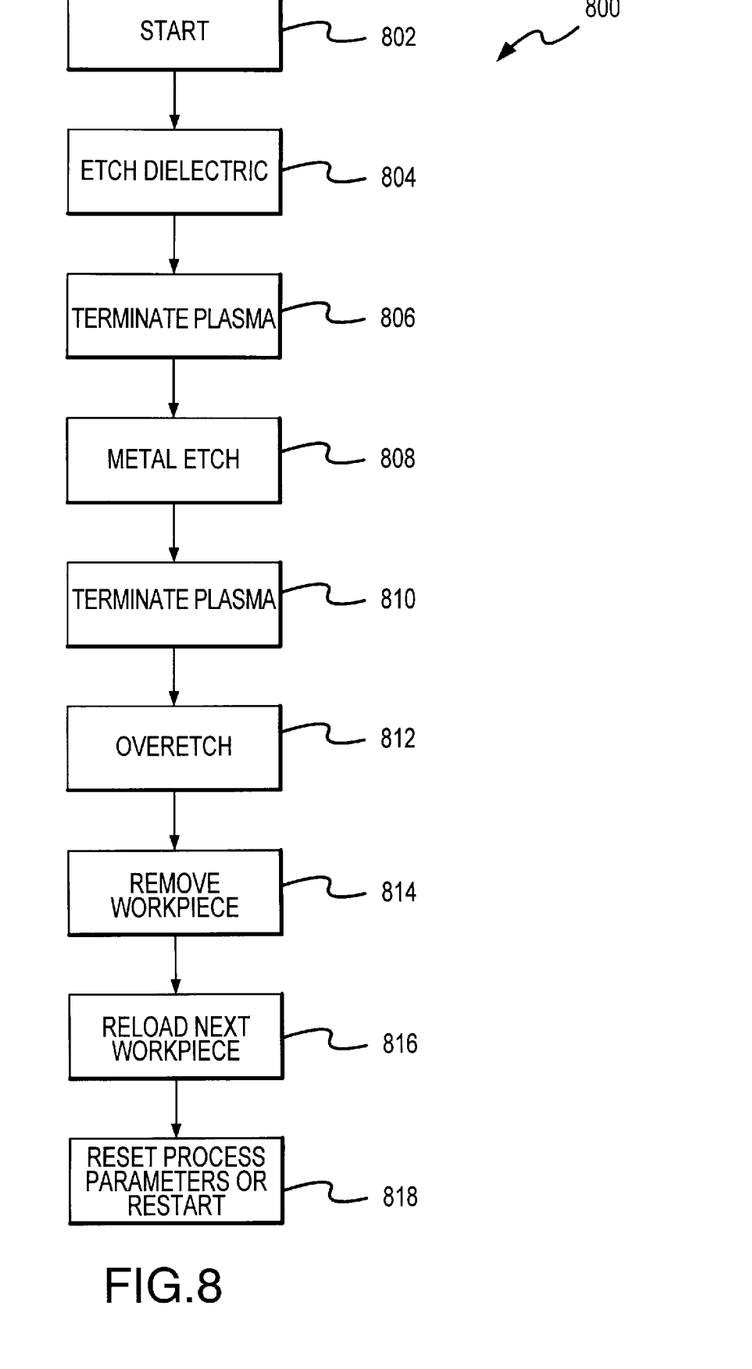
FIG. 8 is a flow chart setting forth various process steps employed in the context of the present invention.

With continued reference to FIG. 7 and referring also to FIG. 6 and 8, an in-situ ARC etching process and an in-situ metal etching process may suitably be performed in accordance with the following method:

When it is desired to etch the inorganic ARC layer 606 (see FIG. 6a), the substrate comprising metallic stack 602 and the photoresist structures formed thereon is suitably placed on chuck 716 (the interconnect workpiece modeled as workpiece 718 in FIG. 7). The various processing parameters appropriate for a particular etching recipe are then established (step 802), including, inter alia, setting the proper temperature, pressure, plasma ignition times and dwell times, as well as selection of the appropriate mixture of gasses, gas rates and proportions to be fed to plasma region 722. In a preferred embodiment, helium, nitrogen, or other appropriate medium may be employed to cool the surface of the workpiece via ESC 716, as desired. Once the appropriate parameters are established, the dielectric layer is suitably etched (step 804). In a preferred embodiment, the dielectric layer is suitably an inorganic film, for example, comprising silicon oxynitride, in which case fluorine based chemistries such as $CHF_3$, $C_2F_6$, and $CF_4$ may be employed. In accordance with an alternate embodiment, a metallic mask layer, such as tinitride, may be employed in lieu of the aforementioned inorganic hard mask layer. When an inorganic dielectric is employed, suitable etching chemistries include the aforementioned fluorine based chemistries, in combination with chlorine based chemistries such as $BCL_3$ (boron trichloride) and $CL_2$.

When inorganic layer 606 is substantially or completely etched (or the organic dielectric layer as discussed in the aforementioned offset embodiment), as shown in FIG. 6b, the plasma may be temporarily terminated to accommodate a reconfiguration of the gas mixture (step 806); alternatively, the plasma may remain intact, and a gradual change in the gas composition may be affected to initiate the metal etch step.

The metal etching step (step 808) suitably employs chlorine based chemistries such as $BCL_3$, $CL_2$, or other appropriate metal etching chemistries; as with the dielectric etch step described above in conjunction with step 804, the metal etch process is also desirably conducted in the presence of an $N_2$ (nitrogen) or Ar (argon) gas mixture supplied to plasma chamber 722 from gas supply conduit 720.

When the metal is substantially or completely etched to a desired level, the plasma may be extinguished (step 810). Alternatively, the plasma may remain energized and the gas supplied to plasma chamber may be reformulated in the event it is desired to over etch the surface of the interconnect, for example to clear residuals.

If it is desired to over etch (step 812), chlorine based chemistries such as $BCL_3$, $CL_2$, and the like may be employed with argon (Ar) either in addition to or in lieu of the nitrogen gas. In addition, in a preferred embodiment such over etching may be performed at a lower radio frequency (RF) power, calculated to produce a lower energy plasma at the surface of workpiece 718.

Once the metal etching process is complete (which may or may not include over etching, as desired), workpiece 718 may be removed (step 814), whereupon another workpiece may be placed onto chuck 716 (step 816). The process parameters for the new workpiece are then set (step 818) if they are different than the process parameters employed in conjunction with the previous etching recipes for the previous workpiece; otherwise, the process returns to step 804 for the next cycle of workpiece fabrication.

Selectivity is a major consideration of plasma etching processes. Selectivity can be controlled by selecting the etching gas formula, diluting the gas near the end of the etching process to slow down the attack of the underlying layer, and placing endpoint detectors within the system. Endpoint detectors automatically terminate the etching process upon detecting a predetermined compound or element in the gas stream that exits the etching chamber.

The etch rate of a plasma system is determined by the power supplied to the electrodes which are attached to the workpiece support 716, the gas etchant chemistry, and the vacuum level contained within the etching chamber 702. In accordance with a preferred embodiment of the present invention, fluorine and chlorine based gases are used to etch an inorganic dielectric ARC film. The etch selectivity between the photoresist and the inorganic dielectric ARC is improved by adding fluorine based chemistries such as $CHF_3$, $SF_6$, or other $CH_xF_y$ compounds to the chlorine gas as a breakthrough process. The high etch selectivity between the oxide and the metal is then utilized with only chlorine based plasma. An example containing specific recipes evidencing this preferred embodiment of the present invention is as follows:

Step 1—Chlorine and fluorine based chemistries are mixed to etch the inorganic dielectric ARC using the following recipe: 50 sccm $Cl_2$, 17 sccm $CHF_3$, 12 mtorr, 1300 watts of RF plasma power and 70 watts of bias power. The gas ratio and time period are optimized to produce smooth and straight sidewall profiles without undercut. This step is stopped at the interface between TiN/Ti and AlCu substrate.

Step 2—Chlorine based chemistries such as $BCl_3$ and $Cl_2$ are used along with $N_2$ gas to etch the metal using the following recipe: 50 sccm $Cl_2$, 40 sccm $Bcl_3$, 13 sccm $N_2$, 12 mtorr, 900 watts of RF power, and 150 watts of bias power. This is an endpoint process which senses the interface between the AlCu substrate and oxide on the open fields.

Step 3—Chlorine based chemistries are used to overetch, in order to clear residuals, using the following recipe: 40 sccm $Cl_2$, 30 sccm $BCl_3$, 20 sccm Ar, 10 mtorr, 900 watts of RF power, and 150 watts of bias power for twenty seconds.

All of the above etching steps are carried out within the same etching chamber 702. The single wafer chamber configuration of the planar plasma etch system described above with reference to FIGS. 7 and 8, respectively, possesses the ability to tightly control the etch parameters for uniform etching. In addition, utilization of load lock chambers with single-wafer systems produces a configuration which is amenable to in-line automation thereby resulting in high production rates that can be maintained.

It should be understood that the foregoing description is of preferred exemplary embodiments of the invention and that the invention is not limited to the specific forms or structures shown or described herein. Various modifications may be made in the design, arrangement, and type of elements and structures disclosed herein, as well as the steps of making and using the invention without departing from the scope of the invention as expressed in the appended claims.

What is claimed is:

1. A method of fabricating a semiconductor device of the type comprising a metal layer, an ARC layer disposed on said metal layer, and a photoresist pattern disposed on said ARC layer opposite said metal layer, the method comprising the steps of:

placing said device in a fixture in a plasma etch chamber;

supplying a first plasma etching chemistry to a surface of said device proximate said photoresist pattern;

etching said ARC layer comprising an inorganic dielectric and said photoresist pattern in a first etching step using said first plasma etching chemistry while said device is in said fixture; and supplying a second plasma etching chemistry to said workpiece surface; and etching said metal layer using said second plasma etching chemistry in a second etching step subsequent to said first etching step while said device remains in said fixture.

2. The method of claim 1, further comprising the step of maintaining said workpiece secured within said fixture during and between said first and second etching steps.

3. The method of claim 2, wherein:

said step of supplying said first plasma etching chemistry comprises supplying a fluorine based etching chemistry; and said step of supplying said second plasma etching chemistry comprises supplying a chlorine based etching chemistry.

4. The method of claim 2, wherein:

said first etching step comprises etching said inorganic dielectric layer with a fluorine based etching chemistry; and said second etching step comprises etching said metal layer with a chlorine based etching chemistry.

5. The method of claim 2, further comprising the steps of:

terminating the plasma at the end of said first etching step; and re-energizing the plasma at the beginning of said second etching step.

6. The method of claim 2, further comprising the step of maintaining an energized plasma during and between said first and second etching steps.

7. The method of claim 1, further comprising the steps of:

reducing the plasma energy following said second etching step; and thereafter over etching said device.

8. A method of fabricating a semiconductor interconnect device, comprising the steps of:

applying an inorganic ARC film layer to a metal substrate;

printing a photoresist pattern on said film layer to form a stack comprising said film layer sandwiched between said photoresist pattern and said metal substrate;

placing said stack in a fixture in a plasma etching chamber;

applying a fluorine based plasma to a surface of said stack near said photoresist pattern;

etching said photoresist pattern and said inorganic film layer using said fluorine based plasma;

applying a chlorine based plasma to said stack subsequent to etching said photoresist pattern and said inorganic film without removing said stack from said fixture; and etching said metal substrate using said chlorine based plasma.

9. The method of claim 8, wherein said step of applying said inorganic ARC layer comprises chemical vapor deposition (CVD).

10. The method of claim 9, wherein said CVD step comprises employing plasma enhanced CVD.

11. The method of claim 8, wherein said step of applying said inorganic ARC layer comprises applying silicon oxynitride as said ARC layer.

* * * * *